United States Patent [19]

Flesner et al.

[11] Patent Number: 4,929,831
[45] Date of Patent: May 29, 1990

[54] ELECTRON BEAM APPARATUS FOR TESTING INFRARED DETECTORS IN A CRYOGENICALLY SHIELDED ENVIRONMENT

[75] Inventors: Larry D. Flesner, San Diego; Welsey L. Eisenman; James D. Merriam, both of Del Mar; Richard L. Bates; Rolf N. Dahle, both of San Diego, all of Calif.; Douglas C. Arrington, Albuquerque, N. Mex.

[73] Assignee: The United States of America as represented by the Secretary of the Navy, Washington, D.C.

[21] Appl. No.: 282,717

[22] Filed: Dec. 8, 1988

[51] Int. Cl.$^5$ ............................................. H01J 37/252
[52] U.S. Cl. .................................. 250/307; 250/310; 250/252.1
[58] Field of Search ......... 250/310, 252.1 R, 252.1 A, 250/306, 307

[56] References Cited

U.S. PATENT DOCUMENTS 3,939,347  2/1976  Shifrin ................................. 250/334
4,645,931  2/1987  Gordon et al. ...................... 250/352

OTHER PUBLICATIONS

Flesner et al., "Electron-Beam Apparatus for Testing LWIR Detectors in a Cryogenically Shielded Environment", IEEE Trans. Nucl. Sci., V NS-34, 6 Dec. 1987, pp. 1602-1605.

Primary Examiner—Jack I. Berman
Attorney, Agent, or Firm—Harvey Fendelman; Thomas Glenn Keough; Michael A. Kagan

[57] ABSTRACT

An apparatus for testing infrared detectors in response to a selectively controlled electron beam within a cryogenically shielded environment includes a cryostat having an aperture which is positioned adjacent to a scanning electron microscope. An electron beam emitted from the microscope propagates through the aperture to illuminate an infrared detector mounted within the cryostat so that the detector can be tested in an environment substantially free of spurious infrared radiation.

10 Claims, 4 Drawing Sheets

ELECTRON BEAM APPARATUS FOR TESTING INFRARED DETECTORS IN A CRYOGENICALLY SHIELDED ENVIRONMENT

The invention described herein may be manufactured and used by or for the Government of the United States of America for governmental purposes without the payment of any royalties thereon or therefore.

BACKGROUND OF THE INVENTION

Tests of long wavelength infrared (LWIR) detectors require a low temperature, low photon operating environment. The detectors are sensitive to extraneous ionizing radiation effects typically associated with single radiation pulses, persistent dose rate noise, and total dose degradation. Testing for these effects is complicated by the operating environment in which these types of detectors must be evaluated. For example, testing for persistent dose rate noise (gamma noise) is typically done by exposing detectors housed in cryogenic chambers to Cobalt-60 gamma radiation. The difficulty with this approach is that Compton electrons penetrate the sample volume with variable energies and trajectories because of random origin and scattering, producing a poorly characterized ionizing environment. Data resulting from tests conducted in such environments must be interpreted in terms of these random excitations which cause considerable uncertainty in evaluating the experimental data. Total dose testing can also be accomplished using Cobalt-60 cells. However, large radiation sources are generally required to obtain significant doses in a reasonable time. Selective dosing of samples or devices is not possible with this approach.

The scanning electron microscope (SEM) is a powerful tool for investigating the effects of ionizing radiation because the electron beam energy, propagated beam location, illuminated area, beam intensity (effective dose rate) and beam pulse time can be easily controlled. However, room temperature infrared radiation is too intense to allow testing of infrared detectors with a scanning electron microscope by conventional methods. In order to reduce or eliminate background infrared radiation noise, the infrared detector must be tested in a cryogenic environment. Therefore, a need exists for an apparatus which could provide SEM probing and radiation simulation to an infrared detector shielded within a cryogenic shield.

SUMMARY OF THE INVENTION

The present invention provides an apparatus for testing the response of infrared detectors to a selectively controlled electron beam in a cryogenically shielded environment substantially free of undesired infrared radiation. The invention includes a scanning electron microscope positioned adjacent to a cryostat. An electron beam emitted from the microscope propagates through an aperture in the cryostat so that the beam illuminates an infrared detector placed therein.

The invention advantageously enables testing of a specific region of an infrared detector in response to electron beam radiation while preventing exposure of adjacent regions to unwanted infrared radiation. Such undesirable radiation would prevent effective testing. This invention also makes possible testing which can differentiate relative sensitivities of different regions of an infrared detector and facilitate determination of detector failure mechanisms. Additionally, the invention provides economy and safety of operation relative to systems that perform conventional infrared detector testing utilizing cobalt-60, x-rays, or a linear accelerator.

OBJECTS OF THE PRESENT INVENTION

An object of the present invention is to provide an apparatus which enables infrared detectors to be tested by an electron beam probe in an environment of low infrared background interference.

Another object of the present invention is to provide an apparatus which enables an electron beam to selectively irradiate an infrared detector within a temperature environment of approximately 5 to 70 degrees Kelvin.

DESCRIPTION OF THE PREFERRED EMBODIMENT

Figure 1:
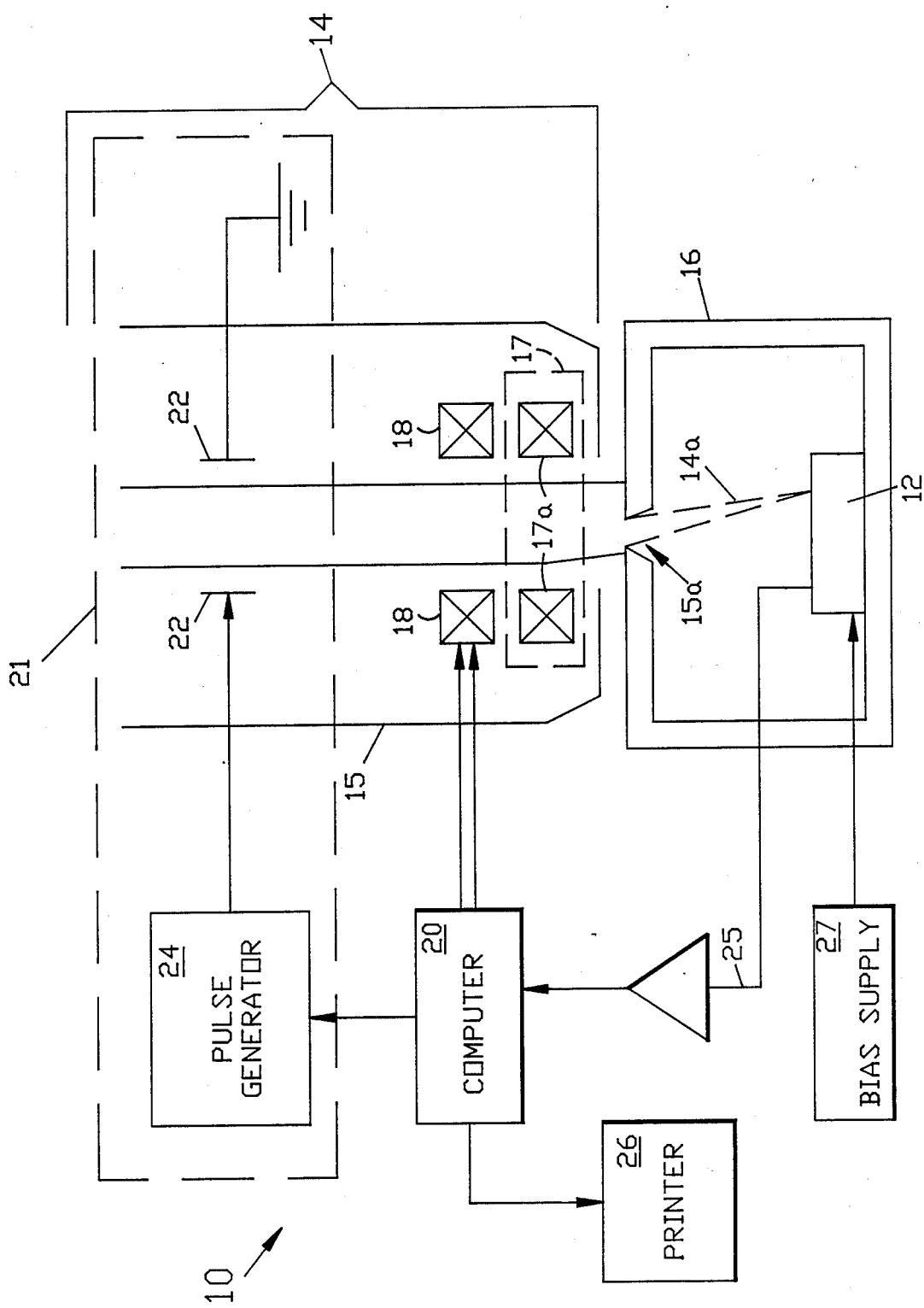
FIG. 1 is a schematic representation of the present invention.

Referring now to the drawings wherein like reference numerals designate like or similar parts throughout the several views, there is illustrated in FIG. 1 a schematic diagram of apparatus 10 for testing infrared detector 12 in an environment of low infrared background noise. Apparatus 10 includes scanning electron microscope (SEM) 14 for generating electron beam 14a. The beam propagates through SEM column 15 from which it then is emitted through aperture 15a in adjacent cryostat 16. SEM 14 has objective focusing lens 17 comprised of coils 17a and deflection coils 18 which are controlled by computer 20 so that electron beam 14a may be selectively focused and directed to illuminate infrared detector 12 in a predetermined suitable 16 pattern. SEM 14 also includes beam blanker system 21 comprised of charge plates 22 and pulse generator 24. Pulse generator 24 activates charge plates 22 in accordance with instructions received from computer 20 to selectively energize electron beam 14a with a predetermined pulse pattern.

Measurement circuit 25 is operably coupled between infrared detector 12 and computer 20 so that various selected properties of infrared detector 12 may be measured in response to irradiation and recorded or displayed by instrument 26 which, for example, may be a plotter, as shown, video display, or printer. Bias supply circuit 27 is operably coupled to infrared detector 12 to energize it so that it is in condition to detect electron beam 14a. Measurement circuit 25 and bias supply circuit 27 are constructed in accordance with well known techniques by those skilled in this art. Furthermore, it is well known by those skilled in this technology to control an electron beam emitted by an SEM with a computer.

One type of suitable scanning electron microscope 14 is JEOL (Japan Electronics Optics Laboratory) Model JSM-35. A suitable computer 20 is Zenith Data Systems, Z-248 PC Series Computer. Specific models of an SEM and a computer have been identified for purposes of illustration only. It is to be understood that the scope of the invention includes models of SEM's and computers other than those identified herein.

Figure 2:
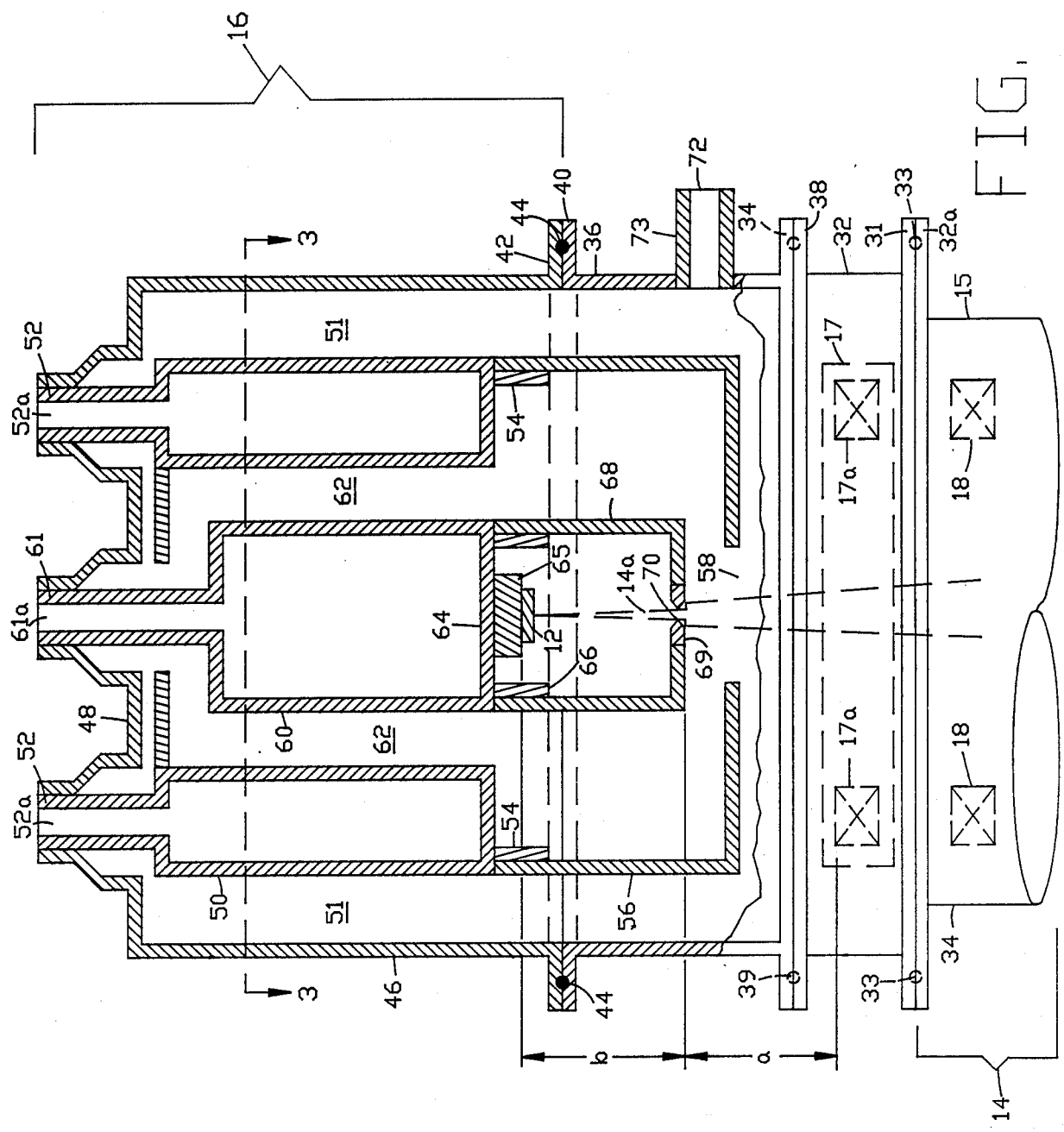
FIG. 2 is a partial cut-away view of the present invention.
Figure 3:
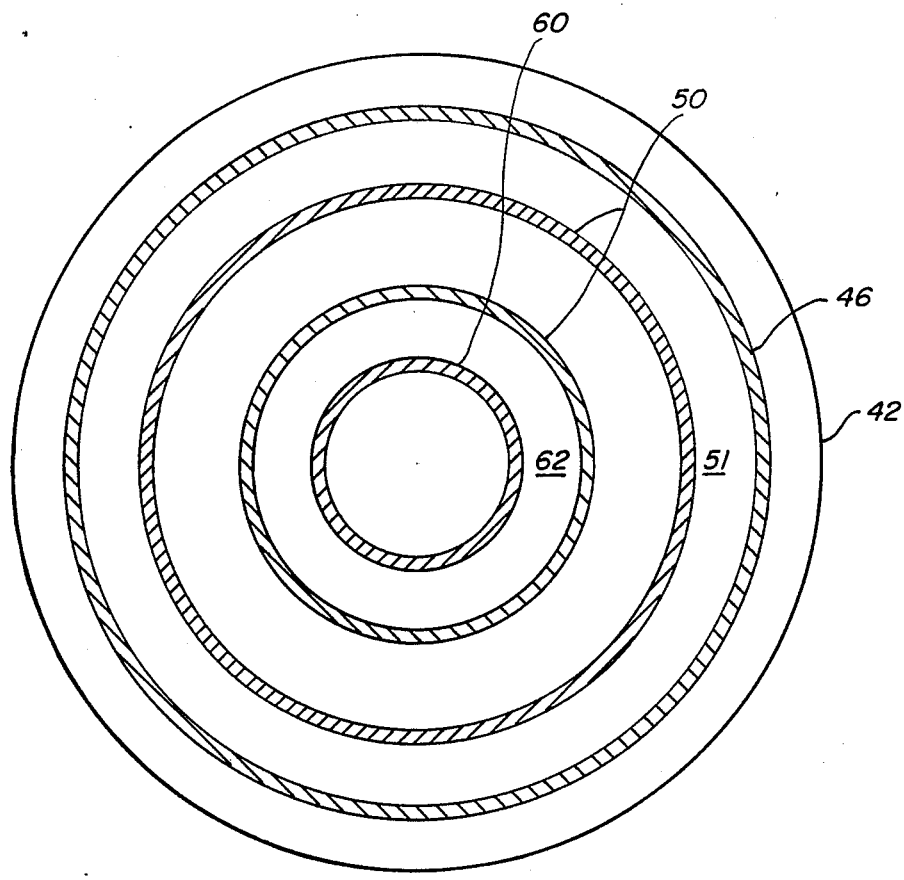
FIG. 3 is a cross-sectional view of the cryostat taken along line 3—3.
Figure 4:
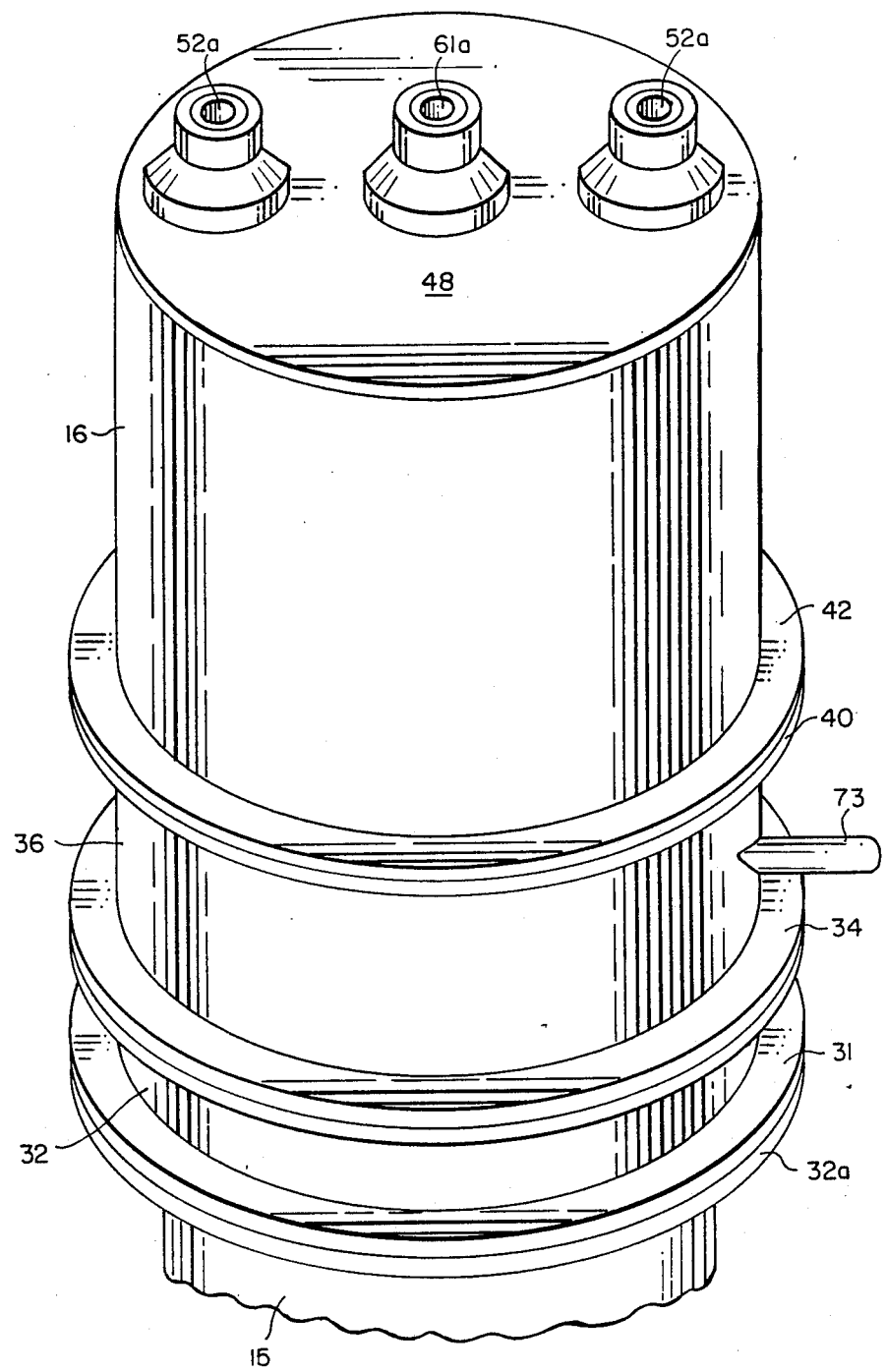
FIG. 4 is a three-quarter perspective view of the cryostat.

Referring to FIGS. 2, 3, and 4 collectively, in which specific features of the construction of the invention are illustrated, SEM 14 was modified by repositioning the standard JEOL model JSM-35 SEM column 15 by 180 degrees so that the electron beam is emitted vertically upward. Annular flange 31 of hollow cylindrical coupler 32 is mounted to annular flange 32a of focusing end 34 of SEM column 15 by techniques well known by those skilled in this technology, as for example by bolting, not shown. "O"-ring 33, interposed between flanges 31 and 32a, provides a vacuum tight seal therebetween. Annular flange 34 of hollow cylindrical spacer 36 is bolted (not shown) to annular flange 38 of coupler 32. "O"-ring 39 is interposed between flanges 34 and 38 to provide a vacuum tight seal therebetween. Annular flange 40 of spacer 36 is bolted (not shown) to annular flange 42 of cryostat 16. "O"-ring 44 is interposed between flanges 40 and 42 to provide a vacuum tight seal therebetween.

Cryostat 16 has a cylindrical outer shell 46 and a top surface plate 48. Inlets 52a provide fluid communication between the exterior of cryostat 16 and the interior of vessel 50. Ring shaped vessel 50 is suspended within cryostat 16 by tubes 52 having inlets 52a which extend through plate 48. The outer diameter of vessel 50 is less than the inside diameter of shell 46, thus creating space 51 therebetween. Annular flange 54 extends from the bottom outside periphery of vessel 50 and is externally threaded (not shown) to receive internally threaded (not shown) cup-like vessel 56. Vessel 56 includes aperture 58 through which the electron beam passes.

Cryostat 16 also includes inner tubular shaped vessel 60. Vessel 60 is suspended inside cryostat 16 and within the inside diameter of vessel 50 by tube 61 having inlet 61a, creating space 62 therebetween. Vessel 60 include bottom plate 64 to which sample mounting plate 65 is mounted. Externally threaded (not shown) annular flange 66 is mounted to the bottom surface of plate 64 and receives internally threaded (not shown) cup-like chamber 68. Chamber 68 includes insert 69 having aperture 70 through which electron beam 14a passes. Apertures 58 and 70 are concentric with respect to each other and may be of any suitable size, although aperture 70 is typically smaller than the width of electron beam 14a. Inlet 61a provides fluid communication between the exterior of cryostat 16 and the interior of vessel 60.

Spacer 36 includes port 72 of pump port 73 through which a vacuum may be drawn within microscope 14, spacer 36, and cryostat 16, exclusive of the interiors of vessels 50 and 60.

Still referring to FIG. 2, good results have been obtained where the distance, a, between focusing coils 17a and aperture 70 is 15 mm; and the distance, b, between aperture 70 and infrared detector 12, is a value preferably in the range of 20 to 40 cm. This range of distance from aperture 70 to detector 12 reduces exposure of detector 12 to room temperature infrared radiation which is admitted through aperture 70. Aperture 58 is approximately 1 cm in diameter. The diameter of aperture 70 is selected to limit leakage of infrared radiation into the infrared shielded environment within the interior of chamber 68 and to control the intensity of electron beam 14a incident upon detector 12. Aperture 70 has been successfully used having a diameter in the range of 10 to 600 micrometers. However, it is to be understood that the scope of the invention includes values for the diameters of apertures 58 and 70, as well as for distances a and b other than those specifically described herein.

OPERATION OF THE INVENTION

Referring to FIGS. 1 and 2, infrared detector 12 is mounted to plate 65. A vacuum is drawn from the interior of cryostat 16, spacer 32, and SEM column 15 through port 72. Liquid helium is poured through inlet 61 so that it then is retained within vessel 60. Liquid nitrogen, poured through either or both of inlets 52a, is retained within vessel 50. Thus, a cold chamber of approximately 5 to 20 degrees Kelvin, substantially free of background infrared radiation, is created within the space defined by the interior of chamber 68 and plate 64. SEM 14 may then be operated to emit electron beam 14a which passes through apertures 58 and 70 so that beam 14a may illuminate infrared detector 12 in a predetermined pattern. Responses of detector 12 then may be propagated through measurement circuit 25 into computer 20 and then recorded by instrument 26.

Obviously, many modifications and variations of the present invention are possible in light of the above teachings. It is therefore to be understood that within the scope of the appended claims the invention may be practiced otherwise than as specifically described.

We claim:

1. An apparatus for testing an infrared detector in a shielded environment, comprising:
   first means for shielding said detector from infrared radiation having a wavelength of at least 1 micrometer;
   second means for propagating a selectively focusable and directable electron beam upon said detector; and
   third means operably coupled to said detector for detecting a response of said detector to exposure to said beam.

2. The apparatus of claim 1 wherein:
   said second means comprises a scanning electron microscope having a directing and focusing end; and
   said first means is a cryostat having an aperture and an interior, said cryostat including a mounting surface for mounting said detector within said interior, said aperture positioned adjacent to said focusing and direction end so that said beam is propagated through said aperture.

3. The apparatus of claim 2 in which said cryostat includes:
   a cooling shield.

4. The apparatus of claim 3 in which said cooling shield includes:
   liquid helium.

5. The apparatus of claim 4 in which said cooling shield includes:
   liquid nitrogen.

6. A method for testing an infrared detector in a shielded environment, comprising the steps of:
   shielding said detector from infrared radiation having a wavelength of at least 1 micrometer;
   propagating a selectively focusable and directable electron beam upon said detector; and
   detecting a response of said detector to exposure to said beam.

7. The method of claim 6 wherein:
   the step of shielding includes placing said infrared detector in a cryostat having an aperture; and the step of propagating includes irradiating said infrared detector with said electron beam propagated through said aperture.

8. The method of claim 7 which further includes the step
shielding said cryostat with a cooling shield.

9. The method of claim 8 in which the step of shielding includes:
boiling liquid helium.

10. The method of claim 9 in which the step of shielding includes:
boiling liquid nitrogen.

* * * * *